United States Patent
Park et al.

(10) Patent No.: US 9,289,798 B2
(45) Date of Patent: Mar. 22, 2016

(54) MASK AND MASK ASSEMBLY HAVING THE SAME

(71) Applicant: Samsung Display Co., Ltd., Yongin, Gyeonggi-Do (KR)

(72) Inventors: Sang-Hyuk Park, Yongin (KR); Jae-Min Hong, Yongin (KR); Woo-Young Jung, Yongin (KR); Ha-Nul Kwen, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 386 days.

(21) Appl. No.: 13/789,343

(22) Filed: Mar. 7, 2013

(65) Prior Publication Data

US 2013/0298826 A1    Nov. 14, 2013

(30) Foreign Application Priority Data

May 8, 2012 (KR) .......................... 10-2012-0048720

(51) Int. Cl.
- C23C 14/04 (2006.01)
- B05C 21/00 (2006.01)
- H01L 51/00 (2006.01)

(52) U.S. Cl.
CPC ............. *B05C 21/005* (2013.01); *C23C 14/042* (2013.01); *H01L 51/0011* (2013.01)

(58) Field of Classification Search
CPC ............................ C23C 14/042; B05C 21/005
See application file for complete search history.

(56) References Cited

U.S. PATENT DOCUMENTS

| 5,405,652 A * | 4/1995 | Kashiwagi et al. ........... 427/282 |
| 6,197,452 B1 | 3/2001 | Matumoto |
| 6,414,743 B1 | 7/2002 | Nishi et al. |
| 6,437,496 B1 | 8/2002 | Kim et al. |
| 2005/0115503 A1 * | 6/2005 | Hagiwara et al. ............. 118/721 |

FOREIGN PATENT DOCUMENTS

| KR | 1020100000129 | 1/2010 |
| KR | 1020110082414 | 7/2011 |

* cited by examiner

Primary Examiner — Dah-Wei D Yuan
Assistant Examiner — Stephen Kitt
(74) Attorney, Agent, or Firm — Robert E. Bushnell, Esq.

(57) ABSTRACT

A mask having both ends supported on a frame when a tensile force is applied in a first direction includes: a mask main body unit having a band form extended in the first direction; a plurality of pattern units including a plurality of pattern slits extended and opened in the first direction and separately disposed in a second direction crossing the first direction, and disposed in the mask main body unit in the first direction; and a plurality of dummy units including a plurality of dummy slits separated from each other with the pattern units therebetween, disposed in the mask main body unit, extended and opened in the first direction, and separately disposed in the second direction.

18 Claims, 7 Drawing Sheets

Pitch × 5,
5-stage different design

Pitch × 1,
5-stage different design

Pitch × 5,
5-stage different design
Round increase
(Double slit width)

Pitch × 1,
5-stage different design

Pitch × 6,
5-stage different design

Pitch × 1,
5-stage different design

Pitch × 2,
5-stage different design

Pitch × 1,
5-stage different design

Pitch × 5,
10-stage different design

Pitch × 1,
5-stage different design

MASK AND MASK ASSEMBLY HAVING THE SAME

CLAIM OF PRIORITY

This application makes reference to, incorporates the same herein, and claims all benefits accruing under 35 U.S.C. §119 from an application earlier filed in the Korean Intellectual Property Office on the 8 of May 2012 and there duly assigned Serial No. 10-2012-0048720.

BACKGROUND OF THE INVENTION

1. Field of the Invention

The present invention relates generally to a mask and a mask assembly including the same. More particularly, the present invention relates to a mask used for depositing an organic emission layer and a mask assembly having the same.

2. Description of the Related Art

A display device is a device for displaying images, and recently, a display device including an organic light emitting diode (OLED) has become prominent.

Unlike a liquid crystal display (LCD), the OLED has the characteristic of self-emission and does not require a light source so that the thickness and weight of an overall display device can be reduced. The OLED exhibits high quality characteristics such as low power consumption, high luminance, and a high response speed.

In order to manufacture the OLED display, an electrode with a particular pattern, an organic emission layer, and the like must be formed, for which a deposition method using a mask assembly may be employed.

In further detail, the organic light emitting display includes pixels which are a basic unit for displaying images on a substrate, and which are arrayed in a matrix form, and an organic light emitting diode in which an anode, a first electrode, a cathode, and a second electrode are sequentially formed, with organic emission layers each emitting light such as red, green, blue, etc. for each pixel therebetween. Organic materials forming the organic emission layer are very vulnerable to moisture, oxygen, etc. so that they should be thoroughly isolated from moisture during a process of forming the organic emission layer and after forming the organic emission layer. Accordingly, it is difficult to perform patterning using a general photolithography process. Therefore, the organic emission layer is formed using a mask on which a pattern opening part for penetrating deposition materials only through a portion corresponding to each pattern is formed.

Recently, a mask assembly comprising a frame including an opening part and a plurality of masks in a band shape, both ends of which are fixed to the frame, corresponding to the opening part, has been used.

The mask assembly in the related art is fixed to the frame by applying tensile force to the mask, so that the shape of the pattern formed in the mask may be deformed due to tensile force applied to the mask.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention has been developed in an effort to provide a mask for controlling deformation of a pattern formed in a mask due to a tensile force applied to the mask, and a mask assembly including the same.

An exemplary embodiment of the invention provides a mask having both ends supported on a frame when a tensile force is applied in a first direction, the mask including: a mask main body unit having a band form extended in the first direction; a plurality of pattern units including a plurality of pattern slits extended and opened in the first direction and separately disposed in a second direction crossing the first direction, and disposed in the mask main body unit in the first direction; and a plurality of dummy units including a plurality of dummy slits separated from each other with the pattern units therebetween, disposed in the mask main body unit, extended and opened in the first direction, and separately disposed in the second direction.

A length extended in the first direction of a dummy slit disposed in an outer area in the second direction from among the plurality of dummy slits is shorter than a length extended in the first direction of a dummy slit disposed in a center area in the second direction.

The dummy slit disposed in the outer area in the second direction can be plural, and the length extended in the first direction becomes sequentially shorter as it approaches an outer side in the second direction.

The number of dummy slits disposed in the outer area in the second direction is 5 to 10.

Five dummy slits are disposed in the outer area in the second direction, and a length in the first direction between ends of the neighboring dummy slits from among the dummy slits disposed in the outer area in the second direction is five times a length in the second direction between the neighboring dummy slits.

A width in the second direction of the dummy slit disposed in an outer area in the second direction is twice a width in the second direction of the dummy slit disposed in a center area in the second direction.

Five dummy slits are disposed in the outer area in the second direction, and a length in the first direction between ends of neighboring dummy slits from among the dummy slits that are disposed in the outer area in the second direction is six times a length in the second direction between the neighboring dummy slits.

Five dummy slits are disposed in the outer area in the second direction, and a length in the first direction between ends of neighboring dummy slits from among the dummy slits that are disposed in the outer area in the second direction is twice a length in the second direction between the neighboring dummy slits.

Ten dummy slits are disposed in the outer area in the second direction, and a length in the first direction between ends of the neighboring dummy slits from among the dummy slit disposed in the outer area of the second direction is five times a length in the second direction between the neighboring dummy slits.

Another exemplary embodiment of the invention provides a mask assembly comprising: a frame including an opening; and masks provided in the opening.

According to the embodiments, the mask for controlling the deformation of the pattern formed in a mask caused by the tensile force applied to the mask and the mask assembly having the same are provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 3A shows a mask according to a second exemplary embodiment of the invention, while

FIG. 4A shows a mask according to a third exemplary embodiment of the invention, while

FIG. 5A shows a mask according to a fourth exemplary embodiment of the invention, while

FIG. 6A shows a mask according to a fifth exemplary embodiment of the invention, while

FIG. 7A shows a mask according to a sixth exemplary embodiment of the invention, while

DETAILED DESCRIPTION OF THE INVENTION

Figure 1:
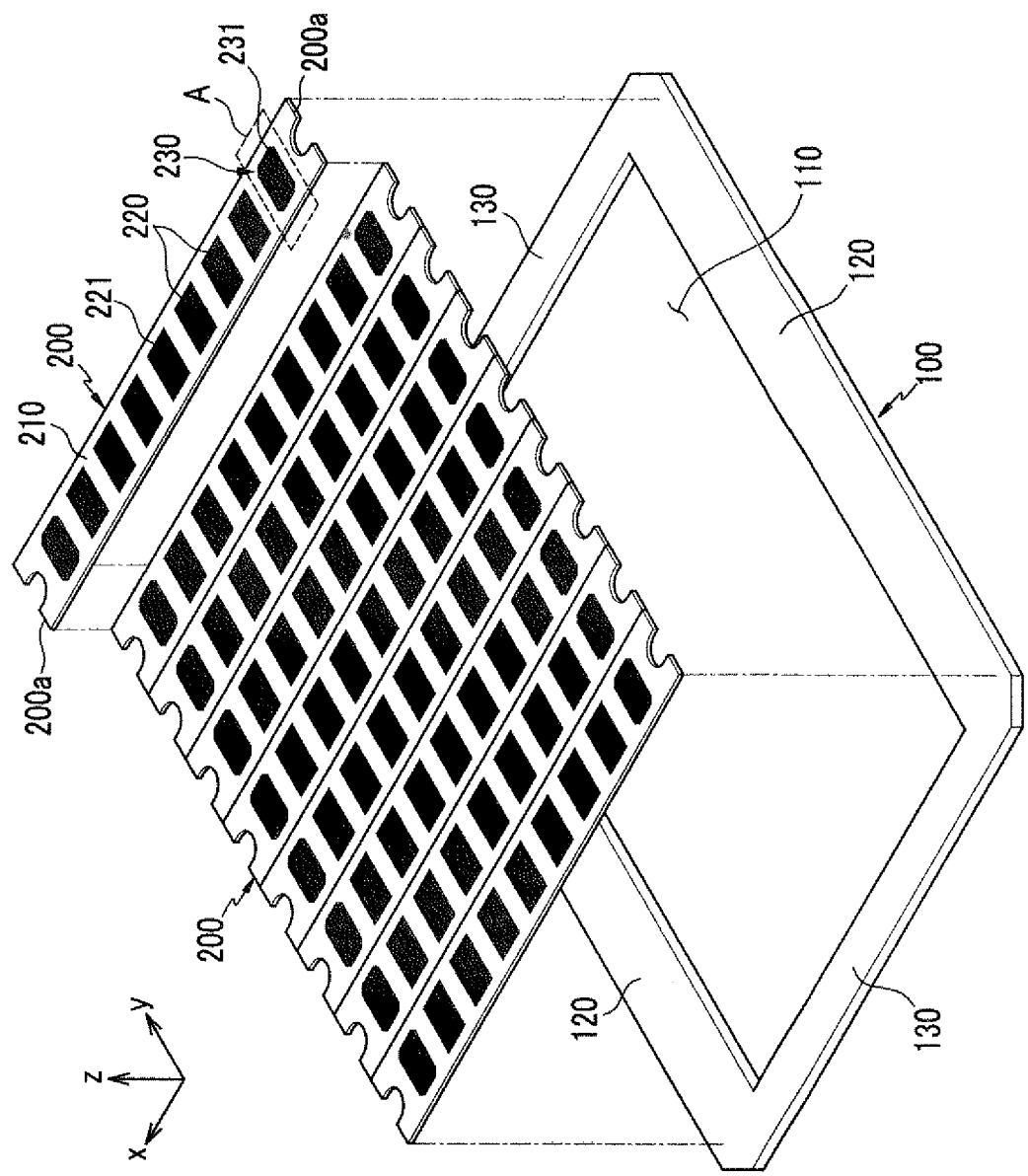
FIG. 1 shows an exploded perspective view of a mask assembly according to a first exemplary embodiment of the invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

In addition, a configuration having the same components denoted by the same reference numerals will representatively be in a first exemplary embodiment of the invention, and other components that are different from the first exemplary embodiment will be described in other exemplary embodiments.

In addition, the size and thickness of each component shown in the drawings are arbitrarily shown for understanding and ease of description, but the present invention is not limited thereto.

In the drawings, the thickness of layers, films, panels, regions, etc. are exaggerated for clarity. For understanding and ease of description, the thickness of some layers and areas is exaggerated. It will be understood that, when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Furthermore, throughout the specification, "on" implies being positioned above or below a target element and does not imply being necessarily positioned on the top on the basis of a gravity direction.

A mask assembly according to a first exemplary embodiment will now be described with reference to FIG. 1 and FIG. 2.

FIG. 1 shows an exploded perspective view of a mask assembly according to a first exemplary embodiment of the invention.

As shown in FIG. 1, the mask assembly includes a frame 100 and a plurality of masks 200.

The frame 100 includes an opening 110 for fixing and supporting both ends of the plurality of masks 200 and exposing the masks 200. The frame 100 further includes a pair of first supporters 120 facing each other in a first direction (x) with the opening 110 therebetween, and a pair of second supporters 130 facing each other in a second direction (y) crossing the first direction (x) with the opening 110 therebetween. Both ends 200a of the mask 200 are supported on the second supporter 130 through a fixing method, such as welding, while a tensile force is applied to the mask 200 in the first direction (x).

In the frame 100 of the mask assembly according to the first exemplary embodiment, the first supporter 120 configures a long side of the quadrangular frame 100 and the second supporter 130 configures a short side of the frame 100, and in the frame of a mask assembly according to another exemplary embodiment, the first supporter and the second supporter can be formed so as to have substantially equivalent lengths. Also, the frame of the mask assembly according to another exemplary embodiment can be configured to be polygonal or circular.

The mask 200 fixed to the frame 100 is supported while the tensile force is applied, and the frame 100 is formed with a metal material such as stainless steel with great rigidity so that it may not be transformed by a compressing force of the mask 200 since the compressing force is applicable in the second direction (y), an elongation direction of the mask 200.

The mask 200 has a band form extended in the first direction (x), and both of the ends 200a are supported on the frame 100 while the tension force is applied in the first direction (x). The mask 200 can be plural, and a plurality of masks 200 are disposed and supported on the frame 100 in the second direction (y). Both of the ends 200a of the mask 200 are formed so as to have a horseshoe form, and they can be formed to have various shapes without being restricted thereto.

The mask 200 includes a mask main body unit 210, a pattern unit 220, and a dummy unit 230.

The mask main body unit 210 has a band form extended in the first direction (x), it is provided over the opening 110 of the frame 100, and it is supported on the frame 100. The mask main body unit 210 includes a plurality of pattern units 220 that are disposed in the first direction (x), and a dummy unit 230 which is separated from the pattern units 220 with a gap therebetween and which is disposed on an end of the mask main body unit 210.

The pattern unit 220 includes a plurality of patterns that are disposed in the first direction (x) on the single mask 200. The pattern unit 220 can correspond to a single organic light emitting diode (OLED) display, and in this case, patterns for configuring a plurality of organic light emitting diode (OLED) displays can be simultaneously formed on a mother substrate on which the organic light emitting diode (OLED) display will be manufactured by a single process through the mask 200. That is, the pattern unit 220 is disposed on the mask main body unit 210 in correspondence to the patterns that configure the organic light emitting diode (OLED) display. The pattern unit 220 has an open pattern form for penetrating the mask 200 so that the patterns configuring the organic light emitting diode (OLED) display may be formed on the mother substrate through the pattern unit 220. The form of the pattern unit 220 includes a plurality of stripe-type pattern slits 221.

The pattern slits 221 are extended and opened in the first direction (x), respectively, and each pattern slit 221 is separately disposed in the second direction (y) crossing the first direction (x).

The dummy unit 230 can be plural, and the dummy units 230 are separately disposed with respect to each other with the pattern unit 220 disposed in the first direction (x) therebetween. That is, the dummy unit 230 is disposed so as to be adjacent to both ends 200a of the mask 200. The dummy unit 230 is provided between the end 200a of the mask 200 and the outermost pattern unit 220 from among the plurality of pattern units 220 that are disposed in the first direction (x), and it divides the tensile force applied to the pattern unit 220 by the tensile force applied to the mask 200. The dummy unit 230 disperses the tensile force applied to the pattern unit 220 to thus control transformation of the pattern unit 220 because of the tensile force applied to the mask 200. The dummy unit 230 corresponds to the frame 100 and is provided in the frame 100. Therefore, a deposition material is prevented from being deposited on the mother substrate through the dummy unit 230 in a deposition process using a probe assembly. The dummy unit 230 includes a plurality of stripe-type dummy slits 231 in a like manner to the pattern unit 220.

The plurality of dummy slits 231 are extended and opened in the first direction (x), respectively, and the dummy slits 231 are separately disposed in the second direction (y).

Figure 2:
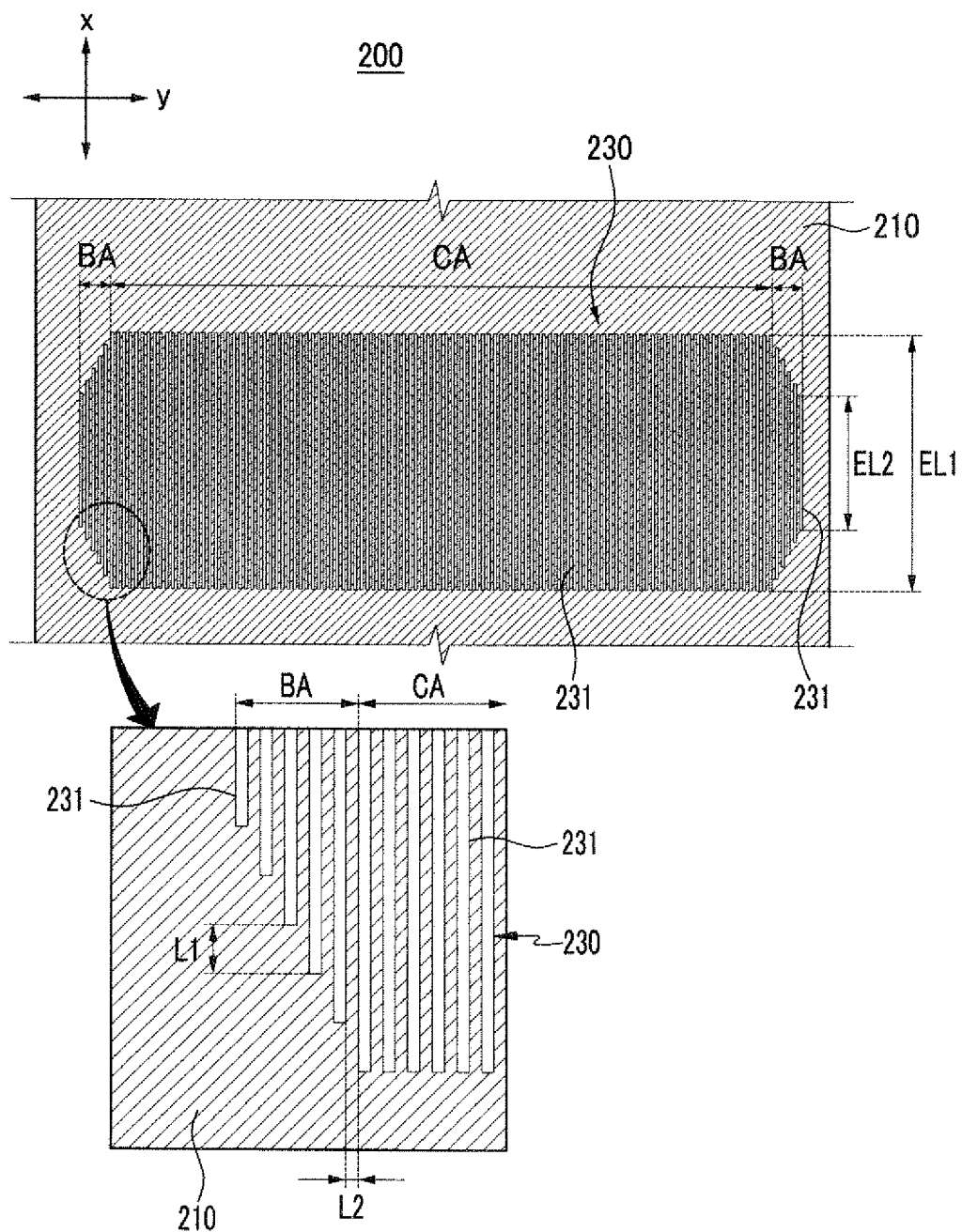
FIG. 2 shows a part A shown in FIG. 1.

FIG. 2 shows a part A shown in FIG. 1.

As shown in FIG. 2, a first-direction (x) extended length EL2 of the dummy slit 231 disposed in an outer area (BA) in the second direction (y) from among the plurality of dummy slits 231 is shorter than the first-direction (x) extended length EL1 of the dummy slit 231 disposed in a center area (CA) in the second direction (y), and the first-direction (x) extended length EL2 of the dummy slit 231 disposed in the outer area (BA) becomes sequentially shorter as it approaches the outer area. As the plurality of dummy slits 231 that are disposed in the outer area (BA) come to the outer side, the extended length EL2 in the first direction (x) sequentially becomes shorter to thus control transformation of the dummy slit 231 by the tensile force applied to the mask 200. The number of dummy slits 231 disposed in the outer area (BA) of the second direction (y) can be 5 to 10. Furthermore, a length L1 in the first direction (x) between the ends of the neighboring dummy slits 231 from among the dummy slits 231 disposed in the outer area (BA) in the second direction (y) can be two to six times a length L2 in the second direction (y) between the neighboring dummy slits 231.

In detail, when both ends 200a of the mask 200 are extended by using an extending means such as a clamp, more stress is applied to the part that corresponds to an edge of the mask 200 compared to other parts, but as a plurality of dummy slits 231 disposed in the outer area (BA) provided in a position that corresponds to the edge part of the mask 200 go to the outer part, the extended length EL2 in the first direction (x) sequentially becomes shorter so as to disperse the stress applied to the part that corresponds to the edge part of the mask 200 so that transformation of the dummy slit 231 because of the tensile force applied to the mask 200 is controlled. Transformation of the dummy slit 231 is controlled and transformation of the dummy unit 230 is, as a result, controlled so that transformation of the pattern unit 220 caused by transformation of the dummy unit 230 is prevented.

As described, the mask assembly according to the first exemplary embodiment comprises the dummy unit 230 including the pattern unit 220 and the dummy slit 231 so that the transformation of the pattern unit 220 formed on the mask 200 is controlled by the tensile force applied to the mask 200.

Furthermore, regarding the mask assembly according to the first exemplary embodiment, the extended length EL2 in the first direction (x) sequentially becomes shorter as the dummy slits 231 disposed in the outer area (BA) in the second direction (y) of the dummy unit 230 go to the outer part, and the tensile force applied to the dummy slit 231 disposed in the outer area (BA) is divided so that the transformation of the dummy unit 230 is controlled, and transformation of the pattern unit 220 caused by transformation of the dummy unit 230 is controlled.

Also, when the number of dummy slits 231 disposed in the outer area (BA) in the second direction (y) is 5 to 10 and the length L1 in the first direction (x) between the ends of the neighboring dummy slit 231 from among the dummy slits 231 disposed in the outer area (BA) in the second direction (y) is two to six times the length L2 in the second direction (y) between the neighboring dummy slits 231, the effect of dividing the tensile force of the mask according to the embodiment is maximized, which will now be described with reference to a mask according to a second exemplary embodiment to a sixth exemplary embodiment of the invention.

A mask according to a second exemplary embodiment to a sixth exemplary embodiment will now be described with reference to FIG. 3A to FIG. 7B.

Parts that are different from the first exemplary embodiment will be described, and other parts that are not described follow the first exemplary embodiment. For better comprehension and ease of description, the same constituent elements in the second exemplary embodiment to the sixth exemplary embodiment will have the same reference numerals as the first exemplary embodiment.

A mask according to a second exemplary embodiment will now be described with reference to FIGS. 3A and 3B.

Figure 3A:
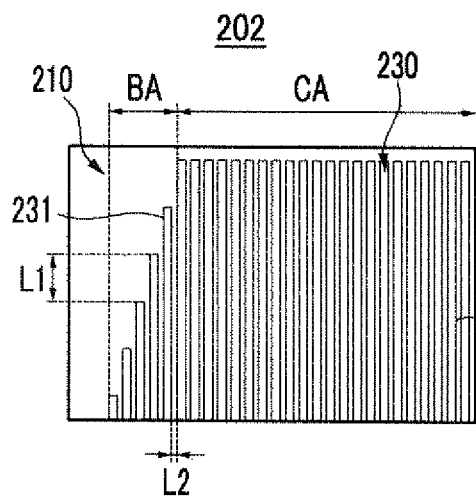
Figure 3B:
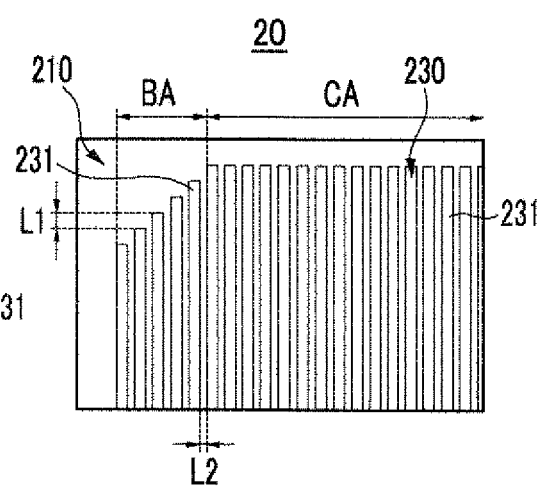
FIG. 3B shows a mask according to a comparative example.
Figure 3B:
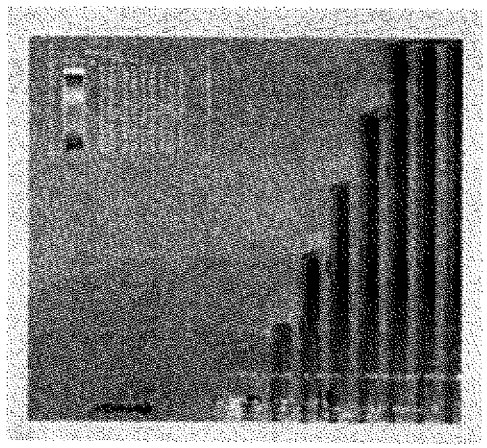
Figure 3B:
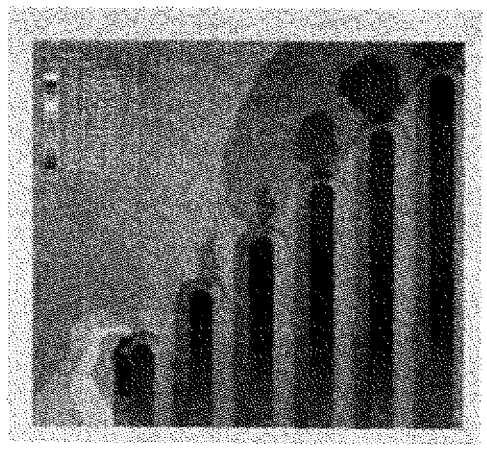

FIG. 3A shows a mask according to a second exemplary embodiment of the invention, while FIG. 3B shows a mask according to a comparative example.

An upper drawing of FIG. 3A shows a dummy slit of a mask according to a second exemplary embodiment, and a lower drawing thereof shows a simulation of the stress applied to the dummy slit of the mask according to the second exemplary embodiment by using ABAQUS, a tool for analyzing a configuration, electricity, and heat, sold by Simulia of Dassault Systèmes, when the mask is extended.

An upper drawing of FIG. 3B shows a dummy slit of a mask according to a compared exemplary embodiment, and a lower drawing thereof shows a simulation of the stress applied to the dummy slit of the mask according to the compared exemplary embodiment by using ABAQUS, a tool for analyzing a configuration, electricity, and heat, sold by Simulia of Dassault Systèmes, when the mask is extended.

As shown in the upper drawing of FIG. 3A, five dummy slits 231 are disposed in the outer area (BA) in the second direction (y) of the mask 202 according to the second exemplary embodiment, and the length L1 in the first direction (x) between the ends of the neighboring dummy slits 231 from among the dummy slits 231 that are disposed in the outer area (BA) in the second direction (y) is five times the length L2 in the second direction (y) between the neighboring dummy slits 231.

As shown in the upper drawing of FIG. 3B, five dummy slits 231 are disposed in the outer area (BA) in the second direction (y) of the mask 202 according to the compared exemplary embodiment, and the length L1 in the first direction (x) between the ends of the neighboring dummy slits 231 from among the dummy slits 231 that are disposed in the outer area (BA) in the second direction (y) is the same as the length L2 in the second direction (y) between the neighboring dummy slits 231.

As shown in the lower drawing of FIG. 3A and the lower drawing of FIG. 3B, when the mask 202 according to the second exemplary embodiment and the mask according to the comparative example are compared through a simulation, the maximum stress applied to the outermost dummy slit 231 in the second direction (y) of the mask 202 according to the second exemplary embodiment is substantially determined to be 316.8 MPa, and the maximum stress applied to the outermost dummy slit 231 in the second direction (y) of the mask according to the comparative example is determined to be 467.5 MPa.

That is, the mask 202 according to the second exemplary embodiment has five dummy slits 231 that are disposed in the outer area (BA) in the second direction (y), the length L1 in the first direction (x) between the ends of the neighboring dummy slits 231 from among the dummy slits 231 disposed in the outer area (BA) in the second direction (y) is five times the length L2 in the second direction (y) between the neighboring dummy slits 231, and the tensile force applied to the dummy slit 231 disposed in the outer area (BA) is divided so that transformation of the dummy unit 230 is controlled, which functions as a factor for preventing the transformation of the pattern unit 220 and provides the mask 202 with improved reliability.

A mask according to a third exemplary embodiment will now be described with reference to FIGS. 4A and 4B.

Figure 4A:
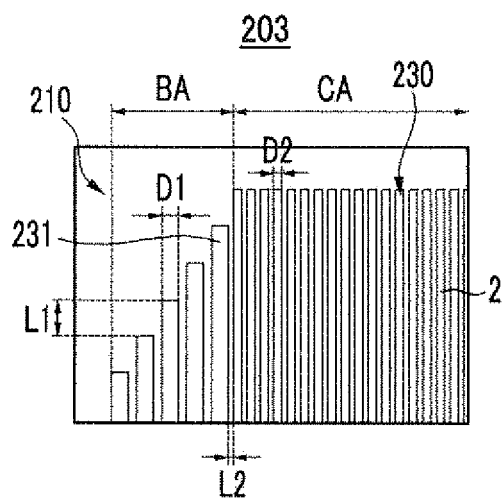
Figure 4B:
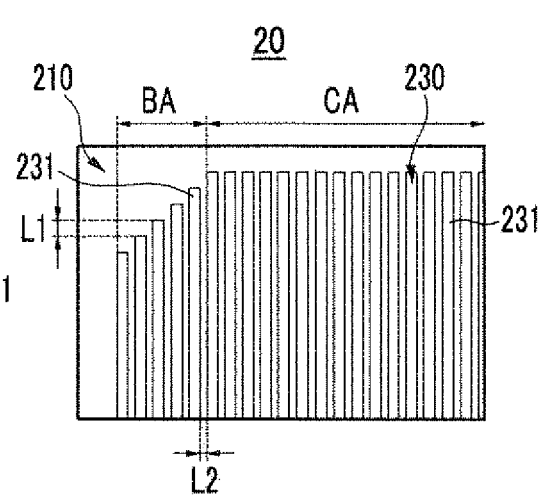
FIG. 4B shows a mask according to a comparative example.
Figure 4B:
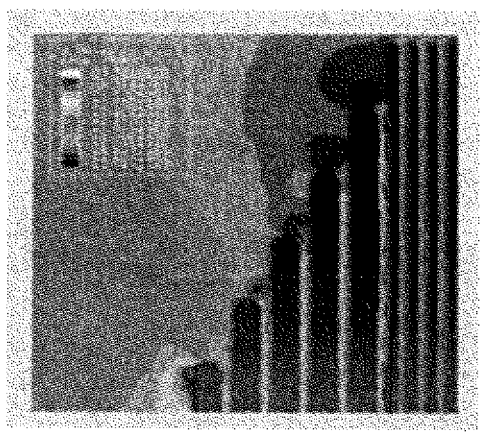
Figure 4B:
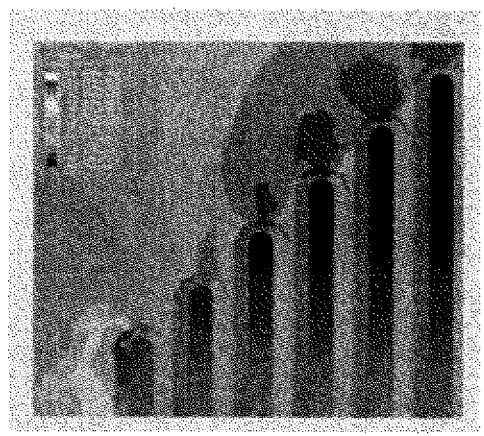

FIG. 4A shows a mask according to a third exemplary embodiment of the invention, while FIG. 4B shows a mask according to a comparative example.

An upper drawing of FIG. 4A shows a dummy slit of a mask according to a third exemplary embodiment, and a lower drawing thereof shows a simulation of the stress applied to the dummy slit of the mask according to the third exemplary embodiment by using ABAQUS, a tool for analyzing a configuration, electricity, and heat, sold by Simulia of Dassault Systèmes, when the mask is extended.

An upper drawing of FIG. 4B shows a dummy slit of a mask according to a compared exemplary embodiment, and a lower drawing thereof shows a simulation of the stress applied to the dummy slit of the mask according to the compared exemplary embodiment by using ABAQUS, a tool for analyzing a configuration, electricity, and heat, sold by Simulia of Dassault Systèmes, when the mask is extended.

As shown in the upper drawing of FIG. 4A, five dummy slits 231 are disposed in the outer area (BA) in the second direction (y) of the mask 203 according to the third exemplary embodiment, and the length L1 in the first direction (x) between the ends of the neighboring dummy slits 231 from among the dummy slits 231 that are disposed in the outer area (BA) in the second direction (y) is five times the length L2 in the second direction (y) between the neighboring dummy slits 231. Furthermore, a second-direction (y) width D1 of the dummy slit 231 disposed in the outer area (BA) in the second direction (y) of the mask 203 is twice a second-direction (y) width D2 of the dummy slit 231 disposed in the center area (CA) in the second direction (y).

As shown in the upper drawing of FIG. 4B, five dummy slits 231 are disposed in the outer area (BA) in the second direction (y) of the mask 202 according to the compared exemplary embodiment, and the length L1 in the first direction (x) between the ends of the neighboring dummy slits 231 from among the dummy slits 231 that are disposed in the outer area (BA) in the second direction (y) is the same as the length L2 in the second direction (y) between the neighboring dummy slits 231.

As shown in the lower drawing of FIG. 4A and the lower drawing of FIG. 4B, when the mask 203 according to the third exemplary embodiment and the mask according to the comparative example are compared through a simulation, the maximum stress applied to the outermost dummy slit 231 in the second direction (y) of the mask 203 according to the third exemplary embodiment is substantially determined to be 343.3 MPa, and the maximum stress applied to the outermost dummy slit 231 in the second direction (y) of the mask according to the comparative example is determined to be 467.5 MPa.

That is, the mask 202 according to the second exemplary embodiment has five dummy slits 231 that are disposed in the outer area (BA) in the second direction (y), the length L1 in the first direction (x) between the ends of the neighboring dummy slits 231 from among the dummy slits 231 disposed in the outer area (BA) in the second direction (y) is five times the length L2 in the second direction (y) between the neighboring dummy slits 231, and the second-direction (y) width D1 of the dummy slit 231 disposed in the outer area (BA) in the second direction (y) is twice the second-direction (y) width D2 of the dummy slit 231 disposed in the center area (CA) in the second direction (y) so that the tensile force applied to the dummy slit 231 disposed in the outer area (BA) is dispersed and transformation of the dummy unit 230 is controlled, which functions as a factor for preventing the transformation of the pattern unit 220 and provides the mask 203 with improved reliability.

A mask according to a fourth exemplary embodiment will now be described with reference to FIGS. 5A and 5B.

Figure 5A:
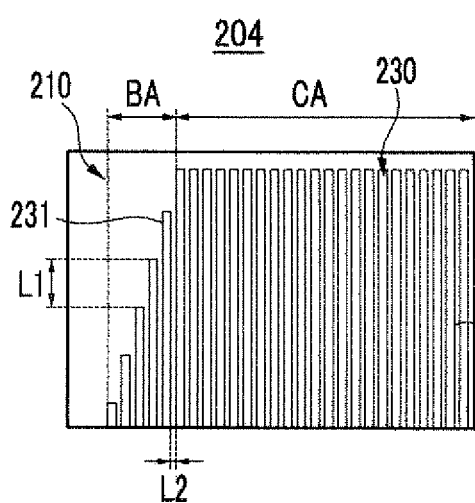
Figure 5A:
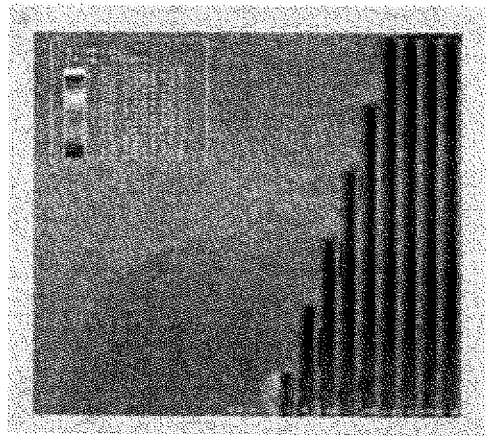
Figure 5B:
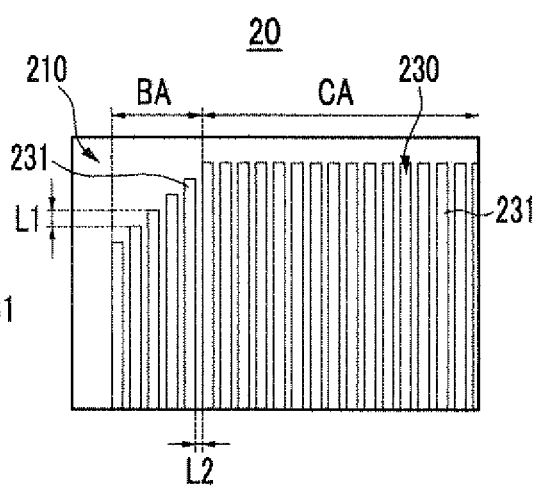
FIG. 5B shows a mask according to a comparative example.
Figure 5B:
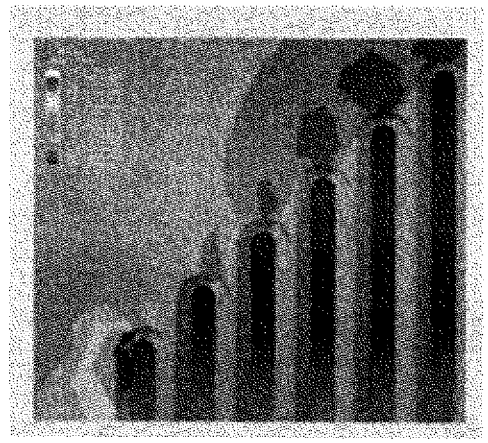

FIG. 5A shows a mask according to a fourth exemplary embodiment of the invention, while FIG. 5B shows a mask according to a comparative example.

An upper drawing of FIGS. 5A shows a dummy slit of a mask according to a fourth exemplary embodiment, and a lower drawing thereof shows a simulation of the stress applied to the dummy slit of the mask according to the fourth exemplary embodiment by using ABAQUS, a tool for analyzing a configuration, electricity, and heat, sold by Simulia of Dassault Systèmes, when the mask is extended.

An upper drawing of FIG. 5B shows a dummy slit of a mask according to a compared exemplary embodiment, and a lower drawing thereof shows a simulation of the stress applied to the dummy slit of the mask according to the compared exemplary embodiment by using ABAQUS, a tool for analyzing a configuration, electricity, and heat, sold by Simulia of Dassault Systèmes, when the mask is extended.

As shown in the upper drawing of FIG. 5A, five dummy slits 231 are disposed in the outer area (BA) in the second direction (y) of the mask 204 according to the fourth exemplary embodiment, and the length L1 in the first direction (x) between the ends of the neighboring dummy slits 231 from among the dummy slits 231 that are disposed in the outer area (BA) in the second direction (y) is six times the length L2 in the second direction (y) between the neighboring dummy slits 231.

As shown in the upper drawing of FIG. 5B, five dummy slits 231 are disposed in the outer area (BA) in the second direction (y) of the mask 202 according to the compared exemplary embodiment, and the length L1 in the first direction (x) between the ends of the neighboring dummy slits 231 from among the dummy slits 231 that are disposed in the outer area (BA) in the second direction (y) is the same as the length L2 in the second direction (y) between the neighboring dummy slits 231.

As shown in the lower drawing of FIG. 5A and the lower drawing of FIG. 5B, when the mask 204 according to the fourth exemplary embodiment and the mask according to the comparative example are compared through a simulation, the maximum stress applied to the outermost dummy slit 231 in the second direction (y) of the mask 204 according to the fourth exemplary embodiment is substantially determined to be 318.7 MPa, and the maximum stress applied to the outermost dummy slit 231 in the second direction (y) of the mask according to the comparative example is determined to be 467.5 MPa.

That is, the mask 204 according to the fourth exemplary embodiment has five dummy slits 231 that are disposed in the outer area (BA) in the second direction (y), the length L1 in the first direction (x) between the ends of the neighboring dummy slits 231 from among the dummy slits 231 disposed in the outer area (BA) in the second direction (y) is six times the length L2 in the second direction (y) between the neighboring dummy slits 231, and the tensile force applied to the dummy slit 231 disposed in the outer area (BA) is divided so that transformation of the dummy unit 230 is controlled, which functions as a factor for preventing the transformation of the pattern unit 220 and provides the mask 204 with improved reliability.

A mask according to a fifth exemplary embodiment will now be described with reference to FIGS. 6A and 6B.

Figure 6A:
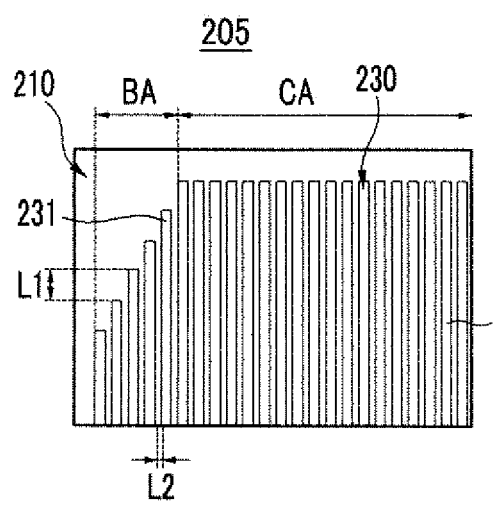
Figure 6B:
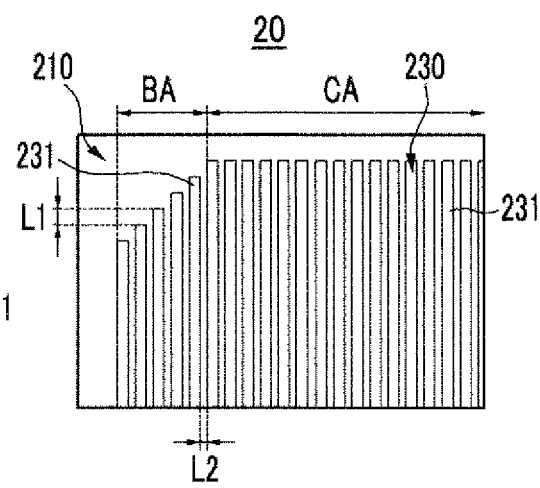
FIG. 6B shows a mask according to a comparative example.
Figure 6B:
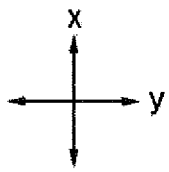
Figure 6B:
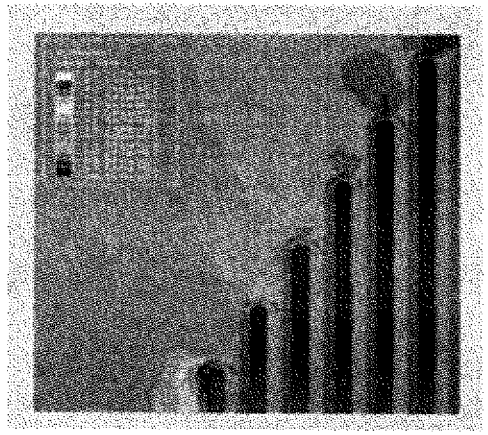
Figure 6B:

FIG. 6A shows a mask according to a fifth exemplary embodiment of the invention, while FIG. 6B shows a mask according to a comparative example.

An upper drawing of FIG. 6A shows a dummy slit of a mask according to a fifth exemplary embodiment, and a lower drawing thereof shows a simulation of the stress applied to the dummy slit of the mask according to the fifth exemplary embodiment by using ABAQUS, a tool for analyzing a configuration, electricity, and heat, sold by Simulia of Dassault Systèmes, when the mask is extended.

An upper drawing of FIG. 6B shows a dummy slit of a mask according to a compared exemplary embodiment, and a lower drawing thereof shows a simulation of the stress applied to the dummy slit of the mask according to the compared exemplary embodiment by using ABAQUS, a tool for analyzing a configuration, electricity, and heat, sold by Simulia of Dassault Systèmes, when the mask is extended.

As shown in the upper drawing of FIG. 6A, five dummy slits 231 are disposed in the outer area (BA) in the second direction (y) of the mask 205 according to the fifth exemplary embodiment, and the length L1 in the first direction (x) between the ends of the neighboring dummy slits 231 from among the dummy slits 231 that are disposed in the outer area (BA) in the second direction (y) is twice the length L2 in the second direction (y) between the neighboring dummy slits 231.

As shown in the upper drawing of FIG. 6B, five dummy slits 231 are disposed in the outer area (BA) in the second direction (y) of the mask 202 according to the compared exemplary embodiment, and the length L1 in the first direction (x) between the ends of the neighboring dummy slits 231 from among the dummy slits 231 that are disposed in the outer area (BA) in the second direction (y) is the same as the length L2 in the second direction (y) between the neighboring dummy slits 231.

As shown in the lower drawing of FIG. 6A and the lower drawing of FIG. 6B, when the mask 205 according to the fifth exemplary embodiment and the mask according to the comparative example are compared through a simulation, the maximum stress applied to the outermost dummy slit 231 in the second direction (y) of the mask 205 according to the fifth exemplary embodiment is substantially determined to be 372.4 MPa, and the maximum stress applied to the outermost dummy slit 231 in the second direction (y) of the mask according to the comparative example is determined to be 467.5 MPa.

That is, the mask 205 according to the fifth exemplary embodiment has five dummy slits 231 that are disposed in the outer area (BA) in the second direction (y), the length L1 in the first direction (x) between the ends of the neighboring dummy slits 231 from among the dummy slits 231 disposed in the outer area (BA) in the second direction (y) is six times the length L2 in the second direction (y) between the neighboring dummy slits 231, and the tensile force applied to the dummy slit 231 disposed in the outer area (BA) is divided so that transformation of the dummy unit 230 is controlled, which functions as a factor for preventing the transformation of the pattern unit 220 and provides the mask 205 with improved reliability.

A mask according to a sixth exemplary embodiment will now be described with reference to FIGS. 7A and 7B.

Figure 7A:
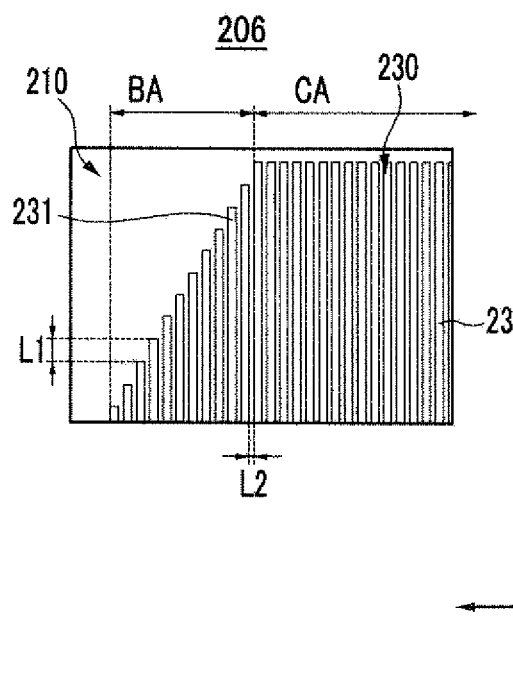
Figure 7A:
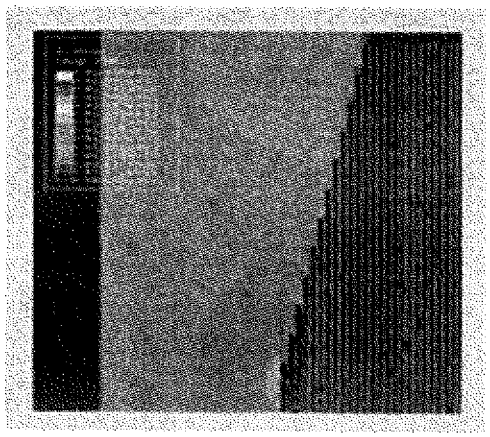
Figure 7B:
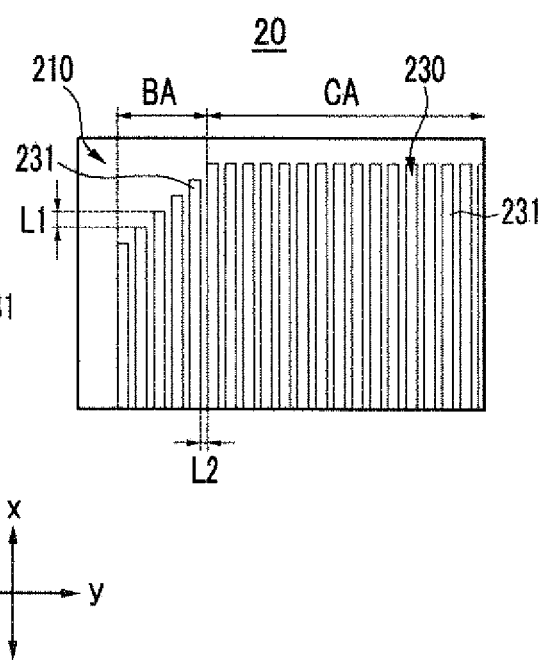
FIG. 7B shows a mask according to a comparative example.
Figure 7B:
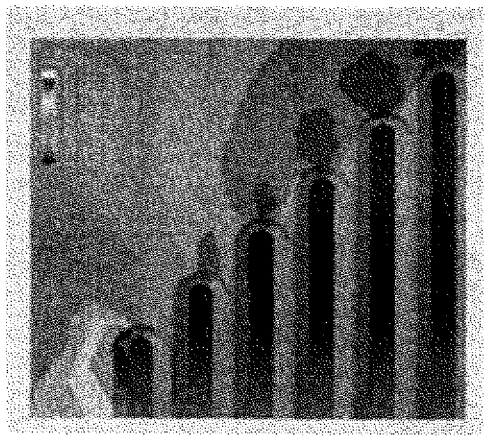

FIG. 7A shows a mask according to a sixth exemplary embodiment of the invention, while FIG. 7B shows a mask according to a comparative example.

An upper drawing of FIG. 7A shows a dummy slit of a mask according to a sixth exemplary embodiment, and a lower drawing thereof shows a simulation of the stress applied to the dummy slit of the mask according to the sixth exemplary embodiment by using ABAQUS, a tool for analyzing a configuration, electricity, and heat, sold by Simulia of Dassault Systèmes, when the mask is extended.

An upper drawing of FIG. 7B shows a dummy slit of a mask according to a compared exemplary embodiment, and a lower drawing thereof shows a simulation of the stress applied to the dummy slit of the mask according to the compared exemplary embodiment by using ABAQUS, a tool for analyzing a configuration, electricity, and heat, sold by Simulia of Dassault Systèmes, when the mask is extended.

As shown in the upper drawing of FIG. 7A, ten dummy slits 231 are disposed in the outer area (BA) in the second direction (y) of the mask 206 according to the sixth exemplary embodiment, and the length L1 in the first direction (x) between the ends of the neighboring dummy slits 231 from among the dummy slits 231 that are disposed in the outer area (BA) in the second direction (y) is five times the length L2 in the second direction (y) between the neighboring dummy slits 231.

As shown in the upper drawing of FIG. 7B, five dummy slits 231 are disposed in the outer area (BA) in the second direction (y) of the mask 202 according to the compared exemplary embodiment, and the length L1 in the first direction (x) between the ends of the neighboring dummy slits 231 from among the dummy slits 231 that are disposed in the outer area (BA) in the second direction (y) is the same as the length L2 in the second direction (y) between the neighboring dummy slits 231.

As shown in the lower drawing of FIG. 7A and the lower drawing of FIG. 7B, when the mask 206 according to the sixth exemplary embodiment and the mask according to the comparative example are compared through a simulation, the maximum stress applied to the outermost dummy slit 231 in the second direction (y) of the mask 206 according to the sixth exemplary embodiment is substantially determined to be 340.6 MPa, and the maximum stress applied to the outermost dummy slit 231 in the second direction (y) of the mask according to the comparative example is determined to be 467.5 MPa.

That is, the mask 206 according to the sixth exemplary embodiment has ten dummy slits 231 that are disposed in the outer area (BA) in the second direction (y), the length L1 in the first direction (x) between the ends of the neighboring dummy slits 231 from among the dummy slits 231 disposed in the outer area (BA) in the second direction (y) is five times the length L2 in the second direction (y) between the neighboring dummy slits 231, and the tensile force applied to the dummy slit 231 disposed in the outer area (BA) is divided so that transformation of the dummy unit 230 is controlled, which functions as a factor for preventing the transformation of the pattern unit 220 and provides the mask 206 with improved reliability.

To summarize, by providing a mask and/or a mask assembly including a frame having an opening in which the mask is provided, wherein the mask comprises a mask main body, a plurality of pattern units extending in a first direction and as described above, and a plurality of dummy units extending and opened in the first direction and separately disposed in a second direction as described above, tensile force applied to dummy slits included in the dummy units is dispersed or divided so that transformation of the dummy units is controlled, thereby preventing transformation of the pattern units and providing the mask and any mask assembly which includes the mask with improved reliability.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A mask having both ends supported on a frame, said mask comprising:
    a mask main body unit having a length extending in a first direction and a width smaller than the length and extending in a second direction crossing the first direction;
    a plurality of pattern units disposed one after another in the first direction on the mask main body unit, each pattern unit including a plurality of pattern slits having a length extending in the first direction and a width smaller than the length and extending in the second direction; and
    two dummy units separated with respect to each other with the pattern units therebetween, each dummy unit including a plurality of dummy slits, each said dummy slit having a length extending in the first direction and a width smaller than the length and extending in the second direction;
    wherein a length extending in the first direction of a dummy slit disposed in an outer area of the dummy unit in the second direction from among the plurality of dummy slits is shorter than a length extending in the first direction of a dummy slit disposed in a center area of the dummy unit in the second direction.

2. The mask of claim 1, wherein the plural dummy slits are disposed in the outer area of the dummy unit in the second direction, and the length in the first direction of said dummy unit becomes sequentially shorter as a distance between said each dummy slit and an outer side of the dummy unit becomes smaller.

3. The mask of claim 2, wherein a number of dummy slits that are disposed in the outer area in the second direction is in a range of 5 to 10.

4. The mask of claim 3, wherein five dummy slits are disposed in the outer area in the second direction; and
    wherein a length, in the first direction, between ends of neighboring dummy slits from among the dummy slits disposed, one after another, in the outer area in the second direction is five times a length in the second direction between the neighboring dummy slits.

5. The mask of claim 4, wherein a width in the second direction of the dummy slit disposed in an outer area in the second direction is twice a width in the second direction of the dummy slit disposed in a center area in the second direction.

6. The mask of claim 3, wherein five dummy slits are disposed one after another in the outer area in the second direction; and
    wherein a length in the first direction between ends of neighboring dummy slits from among the dummy slits that are disposed one after another in the outer area in the second direction is six times a length in the second direction between the neighboring dummy slits.

7. The mask of claim 3, wherein five dummy slits are disposed one after another in the outer area in the second direction; and
    wherein a length in the first direction between ends of neighboring dummy slits from among the dummy slits that are disposed one after another in the outer area in the second direction is twice a length in the second direction between the neighboring dummy slits.

8. The mask of claim 3, wherein ten dummy slits are disposed one after another in the outer area in the second direction; and
    wherein a length in the first direction between ends of neighboring dummy slits from among the dummy slits disposed one after another in the outer area in the second direction is five times a length in the second direction between the neighboring dummy slits.

9. A mask assembly, comprising a frame including an opening and a mask, said mask having both ends supported on the frame, said mask comprising:
    a mask main body unit having a length extending in a first direction and a width smaller than the length and extending in a second direction crossing the first direction;
    a plurality of pattern units disposed one after another in the first direction on the mask main body unit, each pattern unit including a plurality of pattern slits having a length extending in the first direction and a width smaller than the length and extending in the second direction, the plurality of pattern units being provided in the opening in the frame; and
    two dummy units separated with respect to each other with the pattern units therebetween, each dummy unit including a plurality of dummy slits, each said dummy slits having a length extending in the first direction and a width smaller than the length and extending in the second direction;
    wherein a length extending in the first direction of a dummy slit disposed in an outer area of the dummy unit in the second direction from among the plurality of dummy slits is shorter than a length extending in the first direction of a dummy slit disposed in a center area of the dummy unit in the second direction.

10. The mask assembly of claim 9, wherein a length, extending in the first direction, of a dummy slit disposed in an outer area in the second direction from among the plurality of dummy slits is shorter than a length, extending in the first direction, of a dummy slit disposed in a center area in the second direction.

11. The mask assembly of claim 10, wherein plural dummy slits are disposed one after another in the outer area in the second direction, and the length of each dummy slit, extending in the first direction, becomes sequentially shorter as said each dummy slit is closer to an outer side of the dummy unit in the second direction.

12. The mask assembly of claim 11, wherein a number of dummy slits that are disposed one after another in the outer area in the second direction is in a range of 5 to 10.

13. The mask assembly of claim 12, wherein five dummy slits are disposed one after another in the outer area in the second direction; and wherein a length, in the first direction, between ends of neighboring dummy slits from among the dummy slits disposed in the outer area in the second direction is five times a length in the second direction between the neighboring dummy slits.

14. The mask assembly of claim 13, wherein a width in the second direction of the dummy slits disposed one after another in an outer area in the second direction is twice a width in the second direction of the dummy slits disposed in a center area in the second direction.

15. The mask assembly of claim 12, wherein five dummy slits are disposed one after another in the outer area in the second direction; and wherein a length in the first direction between ends of neighboring dummy slits from among the dummy slits that are disposed one after another in the outer area in the second direction is six times a length in the second direction between the neighboring dummy slits.

16. The mask assembly of claim 12, wherein five dummy slits are disposed one after another in the outer area in the second direction; and wherein a length in the first direction between ends of neighboring dummy slits from among the dummy slits that are disposed one after another in the outer area in the second direction is twice a length in the second direction between the neighboring dummy slits.

17. The mask assembly of claim 12, wherein ten dummy slits are disposed one after another in the outer area in the second direction; and wherein a length in the first direction between ends of neighboring dummy slits from among the dummy slits disposed one after another in the outer area in the second direction is five times a length in the second direction between the neighboring dummy slits.

18. The mask assembly of claim 9, wherein the two dummy units are disposed on the frame.

* * * * *